United States Patent

Cory et al.

Patent Number: 5,872,452
Date of Patent: Feb. 16, 1999

[54] APPARATUS AND METHOD FOR THE GENERATION OF GRADIENT MAGNETIC FIELDS FOR HIGH RESOLUTION NMR EXPERIMENTS

[75] Inventors: David G. Cory, Boston; Joel T. Lewandowski, Oxford, both of Mass.

[73] Assignee: Bruker Instruments, Inc., Billerica, Mass.

[21] Appl. No.: 794,477

[22] Filed: Feb. 4, 1997

[51] Int. Cl.[6] .................................................. G01V 3/00
[52] U.S. Cl. .......................................... 324/321; 324/318
[58] Field of Search .................................. 324/321, 320, 324/318, 314, 307, 309

[56] References Cited

U.S. PATENT DOCUMENTS

| | | | |
|---|---|---|---|
| 5,208,536 | 5/1993 | Cory | 324/321 |
| 5,260,657 | 11/1993 | Lewis et al. | 324/321 |
| 5,325,059 | 6/1994 | Doty | 324/321 |

OTHER PUBLICATIONS

Osamu Oishi et al., Institute for Molecular Science, Myodaiji, Okazaki 444, Japan, New PFG NMR Spectrometer with a Rotatable Quadrupole Coil for the Measurement of an Anisotropic Self–Diffusion Coefficient Tensor, Journal of Magnetic Resonance, XP 000633889, Series A 123, pp. 64–71 (1996), Article No. 0214.

Goran Odberg et al, Division of Physical Chemistry, The Royal Institute of Technology, S–100 44, Stockholm 70, Sweden, On the Use of a Quadrupole Coil for NMR Spin–Echo Diffusion Studies, Journal of Magnetic Resonance 16, XP–002064740, pp. 342–347 (1974).

R. Botwell, et al., Magic–Angle Gradient–Coil Design, Magnetic Resonance Center, University of Nottingham, Nottingham NG7 2RD United Kingdom, Journal of Magnetic Resonance, XP 000519712, Series A 115, pp. 55–59 (1995).

Seiichi Miyajima et al., Laboratory of Atomic and Solid Sate Physics, Cornell University, Ithaca, NY 14853–2501, USA, Pulsed–field–gradient stimulated–spin–echo NMR study of anisotropic self–diffusion in smectic Ad liquid crystal CBOOA.

*Primary Examiner*—Louis Arana
*Attorney, Agent, or Firm*—Kudirka & Jobse, LLP

[57] ABSTRACT

A gradient magnetic field generator is provided for generating a spatially varying gradient magnetic field for use with a nuclear magnetic resonance spectroscopy probe having a rotatable sample container. The gradient field generator has a plurality of straight line conductive segments which lie parallel to one another and perpendicular to a plane within which lies a rotation axis about which the sample container rotates. The straight line conductive segments each conduct a current which generates a component of the overall gradient magnetic field. The conductive segments preferably lie in a cylindrical distribution about a stator within which the sample container is rotated. The appropriate currents for the conductive segments may be determined by finding a solution for the Jacobian which defines the magnetic field variations in the three-dimensional space of the stator. Finding an appropriate solution is simplified by presuming the cylindrical distribution of conductive segments and allowing restriction due to the size and shape of the stator, and the physical space between the stator and an inner surface of the probe housing.

19 Claims, 6 Drawing Sheets

APPARATUS AND METHOD FOR THE GENERATION OF GRADIENT MAGNETIC FIELDS FOR HIGH RESOLUTION NMR EXPERIMENTS

BACKGROUND OF THE INVENTION

1. Field of the Invention

The present invention relates to nuclear magnetic resonance (NMR) spectroscopy and, more particularly, to NMR spectrometer probes which can generate a magnetic field gradient along the axis of a sample being rotated at the "magic angle."

2. Description of the Related Art

All atomic nuclei with an odd atomic mass or an odd atomic number possess a nuclear magnetic moment. Nuclear magnetic resonance (NMR) is a phenomenon exhibited by this select group of atomic nuclei (termed "NMR active" nuclei), and is based upon the interaction of the nucleus with an applied, external magnetic field. The magnetic properties of a nucleus are conveniently discussed in terms of two quantities: the gyromagnetic ratio ($\gamma$); and the nuclear spin (I). When an NMR active nucleus is placed in a magnetic field, its nuclear magnetic energy levels are split into (2I+1) non-degenerate energy levels, which are separated from each other by an energy difference that is directly proportional to the strength of the applied magnetic field. This splitting is called the "Zeeman" splitting and is equal to $\gamma h H_o/2\pi$, where h is Plank's constant and $H_o$ is the strength of the magnetic field. The frequency corresponding to the energy of the Zeeman splitting ($w_o = \gamma H_o$) is called the "Larmor frequency" and is proportional to the field strength of the magnetic field. Typical NMR active nuclei include $^1$H (protons), $^{13}$C, $^{19}$F, and $^{31}$P. For these four nuclei I=½, and each nucleus has two nuclear magnetic energy levels.

When a bulk sample containing NMR active nuclei is placed within a magnetic field, the nuclear spins distribute themselves amongst the nuclear magnetic energy levels in accordance with Boltzmann's statistics. This results in a population imbalance between the energy levels and a net nuclear magnetization. It is this net nuclear magnetization that is studied by NMR techniques.

At equilibrium, the net nuclear magnetization is aligned parallel to the external magnetic field and is static. A second magnetic field perpendicular to the first and rotating at, or near, the Larmor frequency can be applied to induce a coherent motion of the net nuclear magnetization. Since, at conventional field strengths, the Larmor frequency is in the megahertz frequency range, this second field is called a "radio frequency" or RF field.

The coherent motion of the nuclear magnetization about the RF field is called a "nutation." In order to conveniently deal with this nutation, a reference frame is used which rotates about the z-axis at the Larmor frequency. In this "rotating frame" the RF field, which is rotating in the stationary "laboratory" reference frame, is static. Consequently, the effect of the RF field is to rotate the now static nuclear magnetization direction at an angle with respect to the main static field direction. By convention, an RF field pulse of sufficient length to nutate the nuclear magnetization through an angle of 90°, or $\pi/2$ radians, is called a "$\pi/2$ pulse."

A $\pi/2$ pulse applied with a frequency near the nuclear resonance frequency will rotate the spin magnetization from an original direction along the main static magnetic field direction into a plane perpendicular to the main magnetic field direction. Because the RF field and the nuclear magnetization are rotating, the component of the net magnetization that is transverse to the main magnetic field precesses about the main magnetic field at the Larmor frequency. This precession can be detected with a receiver coil that is resonant at the precession frequency and located such that the precessing magnetization induces a voltage across the coil. Frequently, the "transmitter coil" employed for applying the RF field to the sample and the "receiver coil" employed for detecting the magnetization are one and the same coil.

In addition to precessing at the Larmor frequency, in the absence of the applied RF energy, the nuclear magnetization also undergoes two relaxation processes: (1) the precessions of various individual nuclear spins which generate the net nuclear magnetization become dephased with respect to each other so that the magnetization within the transverse plane loses phase coherence (so-called "spin-spin relaxation") with an associated relaxation time, $T_2$, and (2) the individual nuclear spins return to their equilibrium population of the nuclear magnetic energy levels (so-called "spin-lattice relaxation") with an associated relaxation time, $T_1$.

The nuclear magnetic moment experiences an external magnetic field that is reduced from the actual field due to a screening from the electron cloud. This screening results in a slight shift in the Larmor frequency (called the "chemical shift" since the size and symmetry of the shielding is dependent on the chemical composition of the sample).

Since the Larmor frequency is proportional to the field strength, it is generally desirable to insure that the main magnetic field and the RF magnetic field are spatially homogeneous, at least in the sample area, so that all parts of the sample generate an NMR signal with the same frequency. However, there are some known applications of NMR techniques for which it is desirable to establish a magnetic field gradient across the sample: examples of such applications include NMR imaging, molecular diffusion measurements, solvent suppression, coherence pathway selection and multiple-quantum filters.

A conventional method of applying such gradients is to use special gradient coils in addition to the coils which generate the main static field and the coils which generate the RF magnetic field. These special coils are located in the NMR probe and generate a magnetic field gradient called a $B_o$ gradient which has at least one field component that has a direction parallel to the main static field direction, but has an amplitude which varies as a function of spatial position. All of the aforementioned NMR applications have been demonstrated utilizing a $B_o$ gradient. The coils which generate the $B_o$ gradients along the Cartesian axes are well-known.

Many samples of solids or gels display rather broad NMR resonances when measured via liquid state NMR methods since the molecules are not free to tumble rapidly and isotropically. These additional broadenings arise from dipole-dipole interactions between spins, the anisotropy of the chemical shift and local variations in the magnetic susceptibility. Magic angle sample spinning (MAS) is a well-known means of restoring the spectra to a seemingly high resolution result by introducing a physical rotation of the sample as a whole about the so-called magic angle, $\theta_m$, to the static field direction, where $\cos\theta_m = \sqrt{1/3}$. This angle corresponds to the bisector of a cube (along the [1,1,1] direction relative to an x,y,z Cartesian coordinate system), and rotation about this axis creates an equal weighting of evolution for the x, y, and z directions, averaging out the local variations. Provided that the spinning rate is fast compared to the line width, sharp resonances are observed in MAS experiments. Spinning rates of from 2 to 10 kHz are routinely achieved in MAS probes.

For certain solid state imaging experiments, gradient coils have been used with MAS probes to create a rotating imaging reference frame which, relative to the sample, appears stationary. This differs from the conventional reference frame which is actually fixed, and within which the sample is rotating relative to the reference frame at the above-mentioned spinning rate. In all of the approaches to creating such a modified reference frame, the gradient fields were caused to rotate synchronously with the sample by modulating the currents through specially designed gradient coils. In order to use three gradient sets to generate a $\partial B_z/\partial \theta_m$ field, a full set of three gradient coils is required, each with its own audio amplifier. The coils are driven by a carefully tuned oscillator circuit that must be phase-locked to the position of the sample. This high degree of complexity is essential for imaging when all three spatial axes are used, but is more than needed for spectroscopy.

In another prior art design, a set of gradient coils has been implemented that creates a gradient field oriented along the magic angle by creating a complex current distribution on a cylinder oriented along the static field. This arrangement was proposed to avoid interferences from dipolar demagnetizing fields and was not designed to operate with a MAS probe. It has the gradient coils wrapped on a cylinder oriented along the main magnetic field direction. This method suffers from a number of difficulties. First, the arrangement would have to take up space which is required for the MAS stator. Secondly, the gradient coil must be precisely aligned with the spinner axis and, with the gradient coil and the stator as two separate pieces, alignment of the two pieces must be performed for each probe. Also, the gradient coil can interfere with the ejection of the sample container.

When implementing gradient spectroscopy experiments in a MAS probe, it would be desirable to have a gradient design in which the gradient is oriented such that the z-component of the magnetic field increases along the axis of the spinner, and the gradient magnetic field is uniform in the planes perpendicular to the spinner axis. It would also be desirable to have a gradient field which is obtained for a DC current through the gradient winding, and for which no synchronization to the spinner motion is necessary. Furthermore, it would be advantageous if such a design was compatible with the mechanical layout of prior-art MAS stator designs, did not interfere with sample insertion/ejection, and had a gradient strength of conventional strength (on the order of 50 G/cm)

SUMMARY OF THE INVENTION

The present invention provides a gradient field generator for an NMR probe which consists of a plurality of straight line conductive segments surrounding a stator within which a sample container is housed. The conductive segments are parallel to one another, and perpendicular to a plane containing a rotation axis about which the sample container is rotatable. Preferably, the conductive segments are equidistant from a center of the sample volume, arranged in a cylindrical distribution around the sample container. The currents through the conductive segments approximate a cylindrical current distribution, and provide a gradient magnetic field across the sample volume which varies in a substantially linear manner along the direction of the rotation axis.

In a preferred embodiment of the invention, the conductive segments are formed by wrapping a conductive material about the body of the stator. The conductive material, preferably wire, is wrapped along the outer surfaces of the stator in the locations, directions and number of turns which allow a DC current to be passed through the conductive material which generates the desired currents in the appropriate conductive segments. Small holes may also be drilled in the body of the stator, and the conductive material passed through these holes to allow wrapping of the conductive material in the desired locations. Magnetic shielding may also be used around the conductive sections to minimize eddy currents in surrounding materials.

Once a desired number of conductive segments is selected, one method of determining the appropriate currents is to specify the Jacobian describing the magnetic field in the three-dimensional space surrounding the sample container. That Jacobian has the form:

$$\begin{vmatrix} \partial B_x/\partial x & \partial B_x/\partial y & \partial B_z/\partial z \\ \partial B_y/\partial x & \partial B_y/\partial y & \partial B_y/\partial z \\ \partial B_z/\partial x & \partial B_z/\partial y & \partial B_z/\partial z \end{vmatrix}$$

where z is the direction of the static magnetic field of the probe, the y-z plane is that in which the stator is adjusted for the magic angle, and x is the direction of the to which the conductive segments run parallel.

For the application of MAS spectroscopy, the Jacobian has the following values:

$$J = \sqrt{1/3} \begin{vmatrix} 0 & 0 & 0 \\ 0 & -1 & \sqrt{2} \\ 0 & \sqrt{2} & 1 \end{vmatrix}$$

Given this constraint, the number of solutions may be further reduced by restricting the locations of the conductive segments to those falling within a cylindrical pattern surrounding the stator. With the only independent variable then being the angle between the position of each conductive segment in the x-y plane and the z-axis, and knowing the desired number of conductors, positions for the conductive segments may be selected along the cylinder surrounding the stator which provide the desired gradient field, and which require currents that are most easily provided.

DETAILED DESCRIPTION OF THE PREFERRED EMBODIMENTS

Figure 1:
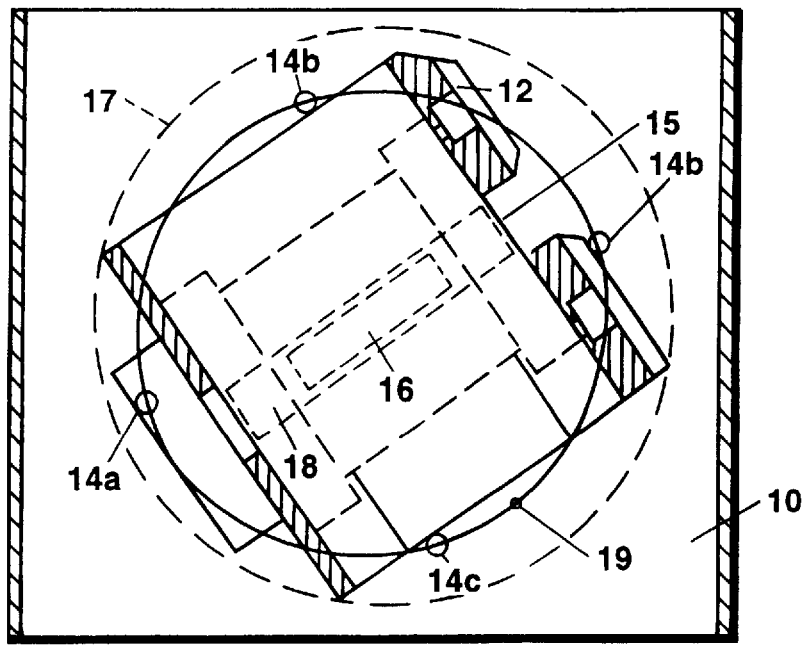
FIG. 1 is a partial cross-sectional side view of a MAS probe and stator having a gradient magnetic field generator according to the present invention.

Shown in FIG. 1 is a cross sectional side view of a portion of the probe housing 10 and stator 12 of a nuclear magnetic resonance (NMR) probe according to the present invention. The probe is intended for use with solid state sample material, and therefore rotates the sample at the well-known "magic angle" relative to the direction of the main magnet field. Provided with FIG. 1 is a two-dimensional Cartesian coordinate system showing the selected designations of direction relative to the probe. In this embodiment, the probe is coaxial with the cylindrical magnet bore and, therefore, the main magnetic field is in the direction of the z-axis. The angular position of the stator 12 within the y-z plane is thus set at the "magic angle" (approximately 54.7° relative to the z-axis).

The probe of FIG. 1 is capable of generating a gradient magnetic field oriented along the magic angle. For clarity, a broken line Cartesian coordinate axis set is overlaid on the y-z coordinates shown in FIG. 1. The broken line axes are labeled z' and y', and represent the y-z plane rotated by the magic angle. Thus, the desired direction of the gradient field is the z' direction. This rotated coordinate system will simplify the description of the present invention provided below.

The probe of FIG. 1 generates the gradient field using straight line conductive segments oriented in the x-direction. The conductive segments (hereinafter "conductors") are located relative to the stator 12, and provided with the necessary current distribution so as to generate the desired gradient field. The conductors are referred to herein generally using the reference numeral 14, with individual conductors being identified by the designations 14a, 14b, etc. In the embodiment of FIG. 1, four conductors are used, but it will become apparent that any number of conductors which is a multiple of four can be used to construct the probe.

The conductors 14 are placed adjacent to the surface of the stator 12, and are physically oriented in the desired position for the generation of the gradient magnetic field. The position of the conductors also takes into account the location of sample ejection port 15, such that the conductors do not inhibit loading and ejection of the sample container. The position and orientation of the conductors 14 is relative to an active sample volume 16 of sample container, or "spinner", 18. In FIG. 1, the spinner 18 and sample volume 16 are shown in outline form to indicate their location. As mentioned above, the currents passed through conductors 14 generate a desired gradient magnetic field in the y and z direction throughout the active volume 16. In the preferred embodiment, the conductors 14 are parallel to one another and equidistant from the center of the sample volume 16. This is demonstrated in FIG. 1 by the circle 19 shown in the y-z plane, which is centered about the center of the active volume 16, and which intersects each of the four conductors 14. Circle 19 demonstrates the cylindrical distribution of the straight line conductors 14 about the center of the sample volume. As discussed below, this orientation of the conductors simplifies the selection of currents to be used for the four conductors 14. Also shown (as a broken line) in FIG. 1 is cylindrical magnetic shielding 17. The shielding may be used to prevent the magnetic fields generated by the conductive sections 14a–14d from inducing eddy currents in surrounding materials. Those skilled in the art will recognize, however, that a complete cylindrical shield can not be used if there is to be ejection of the sample container through ejection port 15.

Figure 2:
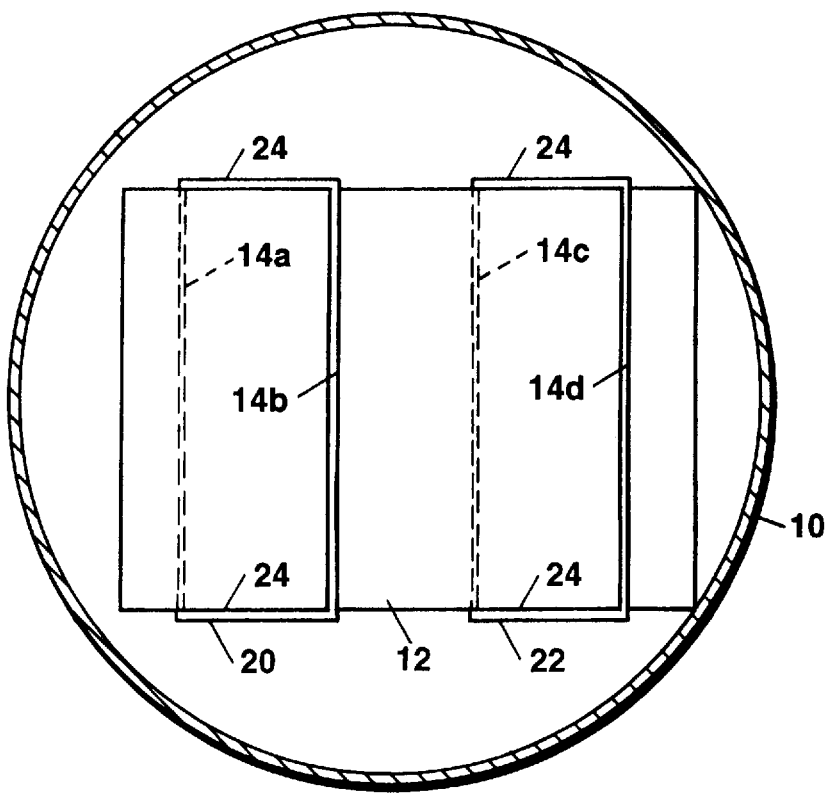
FIG. 2 is a partial cross-sectional top view of the MAS probe and stator of the embodiment shown in FIG. 1.

In the preferred embodiment, the conductors 14 are portions of a conductive material which is wrapped about the stator 12, typically a wire. FIG. 2 is a two-dimensional schematic view of the stator within probe housing 10 relative to the x-y plane, with conductors 14 having been formed from wire wrapped about the stator in two primary loops 20, 22. The two loops are each substantially rectangular in shape, and each consists of one or more wire strands. As shown, each loop has two linear portions 14 parallel to the x-axis (one to a first side of the stator and the other to the opposite side). Loop 20 includes conductors 14a and 14b, while loop 22 includes conductors 14c and 14d. Each loop also has two substantially linear portions 24 residing perpendicular to the x-axis. These linear portions are referred to generally herein by reference numeral 24, and are also referred to individually by reference numerals 24a, 24b, etc.

Because the linear portions 24 are oriented partially in the z-direction, and are far removed from the sample area, they contribute very little to the gradient field. In the preferred embodiment of the invention, the loops 20, 22 are actually part of the same conductor which is wrapped about the stator to form loop 20 in one position, and to form loop 22 in another position. The conductor has two sections (not shown in FIG. 2) which connect the two loops 20, 22.

Figure 3:
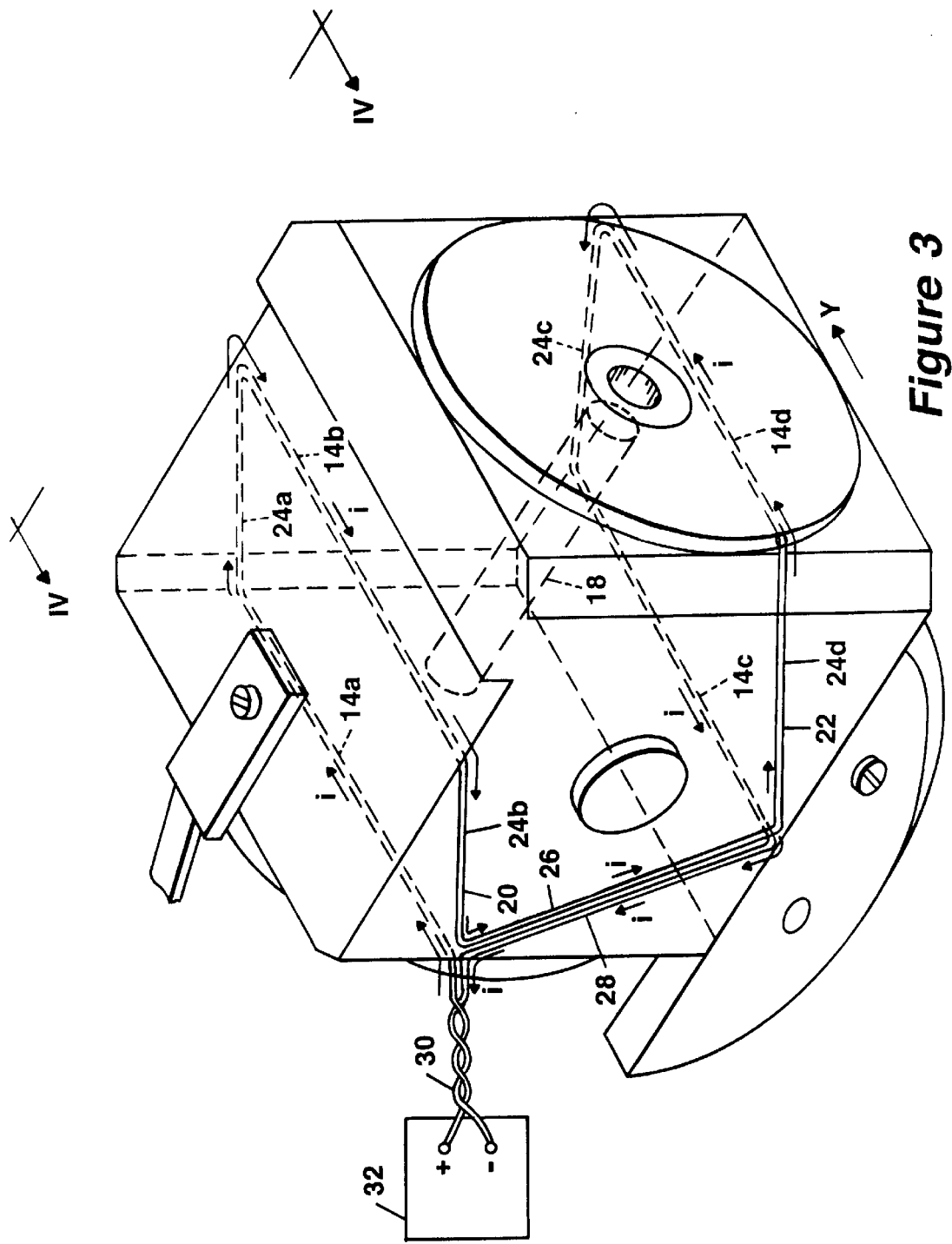
FIG. 3 is an isometric view of the MAS stator of the embodiment of FIG. 1 showing the straight line conductors used to generate the desired gradient magnetic field.
Figure 4:
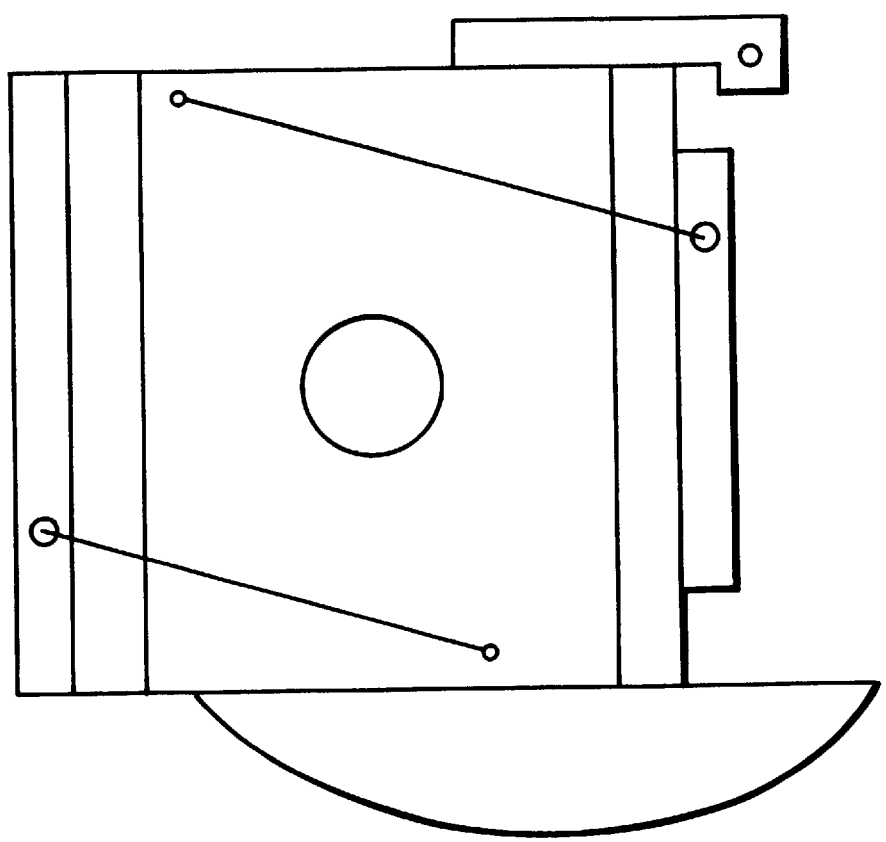
FIG. 4. is a side view of the stator shown in FIG. 3.

FIG. 3 is an isometric view of stator 12 showing the conductive loops 20, 22, consisting of linear conductive segments 14a–14d and linear segments 24a–24d, wrapped around the stator 12. A side view of the stator 12 is also shown in FIG. 4, the orientation of which is indicated by the section line IV—IV in FIG. 3. Referring again to FIG. 3, conductive segments 26, 28 run perpendicular to the x-axis and interconnect the loops 20, 22. To assist in understanding the arrangement shown in the figure, the hidden outer surfaces of the stator are shown using dashed lines, as are the hidden portions of the loops. Also shown in broken lines is sample spinner 18. The depiction of the sample spinner 18 in FIG. 3 is to indicate the location of the spinner 18 relative to the stator 12 and the conductors 14. Those skilled in the art will recognize that there is additional support structure for the spinner 18 within the body of the stator 12 which is not depicted in FIG. 3.

Current through the conductive material surrounding the stator 12 follows a specific path for the stator of FIG. 3. The current enters through one of two conductors which make up twisted conductor pair 30. The current then travels around the loop 20, passing first through conductor 14a, through conductor 24a, back through conductor 14b, and then returning through conductor 24b to the point at which the current first entered the loop. Depending on the position and gauge of the conductive material, the level of current used, and the desired magnetic field, the loop 20 may consist of a number of adjacent turns following the same conductive path as shown for conductors 14a, 24a, 14b and 24b, eventually returning to the point at which the current first enters the loop 20. After the desired number of turns about loop 20, the current passes from loop 20 to loop 22 along conductor 26.

The current traveling along conductor 26 passes to conductor 24d. From conductor 24d, the current travels through conductor 14d, through conductor 24c, and returns along conductor 14c to the point at which it entered the loop 22. As with the loop 20, the loop 22 may actually consist of a number of turns of the conductive material wrapped about the stator 12, following the same path as described above, and returning to the point at which the current entered the loop 22. The current then travels along conductor 28, following the opposite path as the current flowing through conductor 26. The current then follows the second of the two conductors of twisted pair 30, returning to the source of the current, indicated schematically in FIG. 3 as current source 32. Thus, with the appropriate setting on current source 32, the desired currents for each of the four linear conductors 14 are generated.

In general, the use of a single current source to power all of the conductive segments is preferred. When using a single current source, currents of different magnitudes in different segments may be created by using a different number of turns for the different segments. Thus, while there is only one power source, a ratio of turns between various segments establishes a desired ratio of currents.

A straightforward and general approach to determining the appropriate currents through the conductive segments 14 is to first specify the Jacobian that describes the variation of the magnetic field and then to translate this into an ideal current distribution. In general, the Jacobian for the three-dimensional space in the vicinity of the probe has the form:

$$\begin{vmatrix} \partial B_x/\partial x & \partial B_x/\partial y & \partial B_x/\partial z \\ \partial B_y/\partial x & \partial B_y/\partial y & \partial B_y/\partial z \\ \partial B_z/\partial x & \partial B_z/\partial y & \partial B_z/\partial z \end{vmatrix}$$

In NMR experiments the dynamics of the spin system are only sensitive to static fields along the same direction as the externally applied magnetic field, which is typically designated the z-direction. Therefore, for an NMR gradient experiment, it is sufficient to specify the three components, $$\partial B_z/\partial x, \partial B_z/\partial y, \partial B_z/\partial z$$

For the present invention, a magnetic field gradient is desired that increases along the direction of the magic angle. The magic angle has been located within the y-z plane, although the x-z plane could have just as well been selected, since the NMR experiments in question have cylindrical symmetry. The spinner axis (which is aligned with the magic angle) is therefore along the vector, $$\begin{vmatrix} 0 \\ \sin \theta_m \\ \cos \theta_m \end{vmatrix}$$

In the preferred embodiment, the z-component of the gradient field is to increase also in the direction of above vector, and to be uniform otherwise. Thus, the spatial variation in the z-components of the field must satisfy the conditions, $$\partial B_z/\partial x=0, \partial B_z/\partial y=\sin \theta_m, \partial B_z/\partial z=\cos \theta_m.$$

At the magic angle, $\sin \theta_m=\sqrt{2/3}$ and $\cos \theta_m=\sqrt{1/3}$. These conditions obviously do not completely define the Jacobian. Indeed, there are an infinite number of solutions to Maxwell's equations that are consistent with the values given above for these three components. However, in the present invention, the available solutions are limited by the constraint of having the conductive segments located within the available confines of the probe. Thus, the present invention makes use of straight line conductive segments 14 which fit within the leftover space within the probe housing. Since the stator 12 is already oriented within the y-z plane (i.e. relative to the x-axis) it is advantageous to orient the conductive segments parallel to the x-axis. This is demonstrated in FIGS. 1–4, in which the conductive segments 14 are shown relative to stator 12.

The alignment of the conductors parallel to the x-axis simplifies determination of the values of the Jacobian for the desired gradient field since, $$\partial B_x/\partial x=\partial B_x/\partial y=\partial B_x/\partial z=\partial B_y/\partial x=\partial B_z/\partial x=0$$

Under these additional constraints, the following Jacobian is the only one that is consistent with Maxwell's equations:

$$\begin{vmatrix} 0 & 0 & 0 \\ 0 & -\cos \theta_m & \sin \theta_m \\ 0 & \sin \theta_m & \cos \theta_m \end{vmatrix}$$

With $\theta_m$ being equal to the magic angle, this Jacobian may be rewritten as:

$$J = \sqrt{1/3} \begin{vmatrix} 0 & 0 & 0 \\ 0 & -1 & \sqrt{2} \\ 0 & \sqrt{2} & 1 \end{vmatrix}$$

The above Jacobian uniquely defines the magnetic field. However, a distribution of currents that generates this field is also required. For the geometry specified here, one simple solution is to define a distribution of current over the surface of a cylinder oriented along the x-axis. Since the currents are restricted to being along the cylinder surface, then there is only one independent variable, the angle between the current segment on the cylinder and the z-axis. Other distributions may also be used within the context of the invention, but the cylindrical distribution is favored for its simplicity, and because it minimizes the introduction of higher order harmonics into the gradient field.

While in principle the continuous current distribution described above solves the problem, practical solutions are composed of discrete current distributions. Also, the continuous current distribution would interfere with the loading of the sample into the stator. Thus, the arrangement of straight line segments 14 is used in the present invention to provide the desired current distribution. This distribution preserves the symmetry of the above continuous current distribution while fulfilling the six points of the desired gradient field. These points are: 1) only DC currents are used; 2) arrangement is compatible with existing stators; 3) no interference with sample ejection; 4) a strong gradient field is provided; 5) arrangement is compatible with existing gradient amplifier drivers; and 6) the construction is relatively easy to manufacture.

Figure 5:
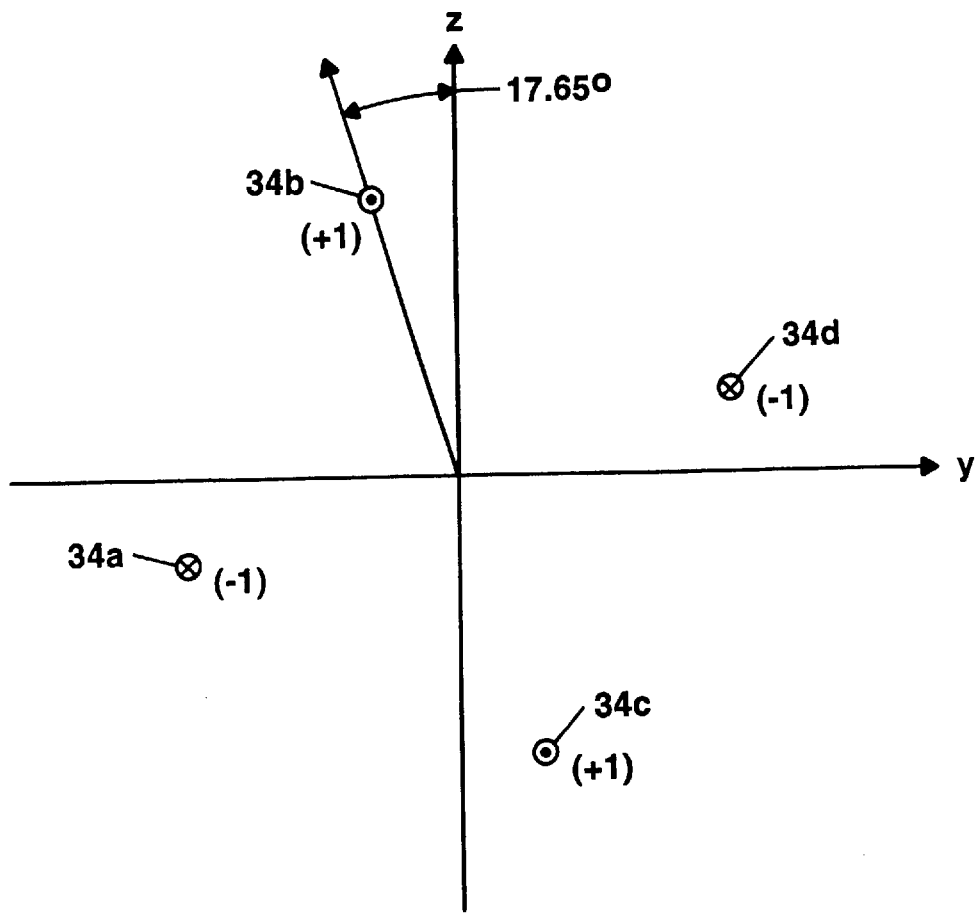
FIG. 5. is a graphical depiction of the current distribution provided by the straight line conductors shown in FIG. 3.

FIG. 5 is a graphical depiction of the current distribution for the embodiment of FIGS. 1–4 relative to the y-z plane. Given the restrictions provided above, it can be seen that the normalized currents for a cylindrical distribution can be described by the term $i_{NORM}(\theta)=\cos(2\theta-90°+\theta_m)$. As shown, using the maxima and minima derived from this term, the location of the currents (and hence the location of the straight line conductive segments) is shifted rotationally from the z-axis by approximately 17.65°. This rotational position is necessary, but different radii of the conductors about the sample may be used. The currents in this embodiment are identified in the figure by reference numerals 34a, 34b, 34c and 34d. Relative to the embodiment of FIGS. 1–4, current 34a is that which flows through conductor 14a, current 34b flows through conductor 34b, current 34c flows through conductor 14c, and current 14d flows through conductor 34d. The normalized magnitude of the currents for this distribution is also shown, being +1 for currents 34b and 34c, while being −1 for currents 34a and 34d. This distribution allows for the simple, wrapped-conductor arrangement shown in FIGS. 1–4, particularly in light of the fact that the magnitude of each of the currents is the same.

Figure 6:
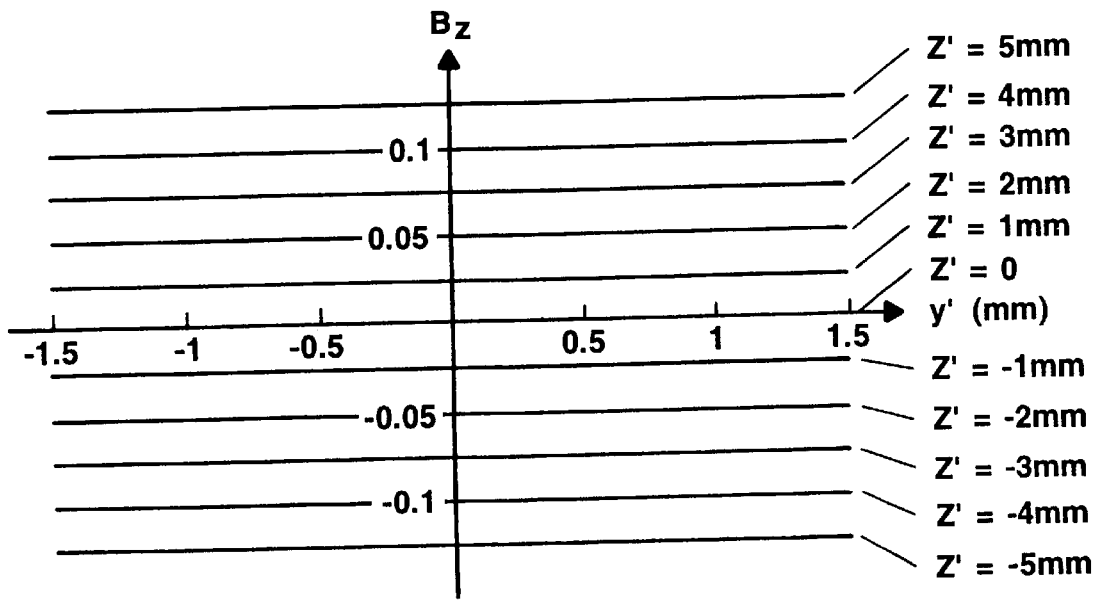
FIG. 6. is a graphical depiction of the gradient field variation for the current distribution shown in FIG. 5.

FIG. 6 is a graphical depiction of the gradient field distribution for the preferred embodiment of the invention (i.e. for the currents shown in FIG. 5). FIG. 6 has a horizontal axis along the y' direction which has a millimeter scale. The vertical axis is along the z' direction, and has a scale of magnetic field strength. The units for the vertical axis are arbitrary. However, the graph is overlaid with horizontal lines each indicative of magnetic field strength for a particular value of z'. The extension of these lines in the horizontal direction shows the slight variations in the gradient magnetic field strength in the y'-direction, for each of a number of different values of z' (i.e., z'=1, z'=2, etc.). These variations are due to the use of the four straight line conductors 14 to generate the gradient field. However, as shown, the linearity of the field lines is quite good, and acceptable for most experimental purposes.

Figure 8:
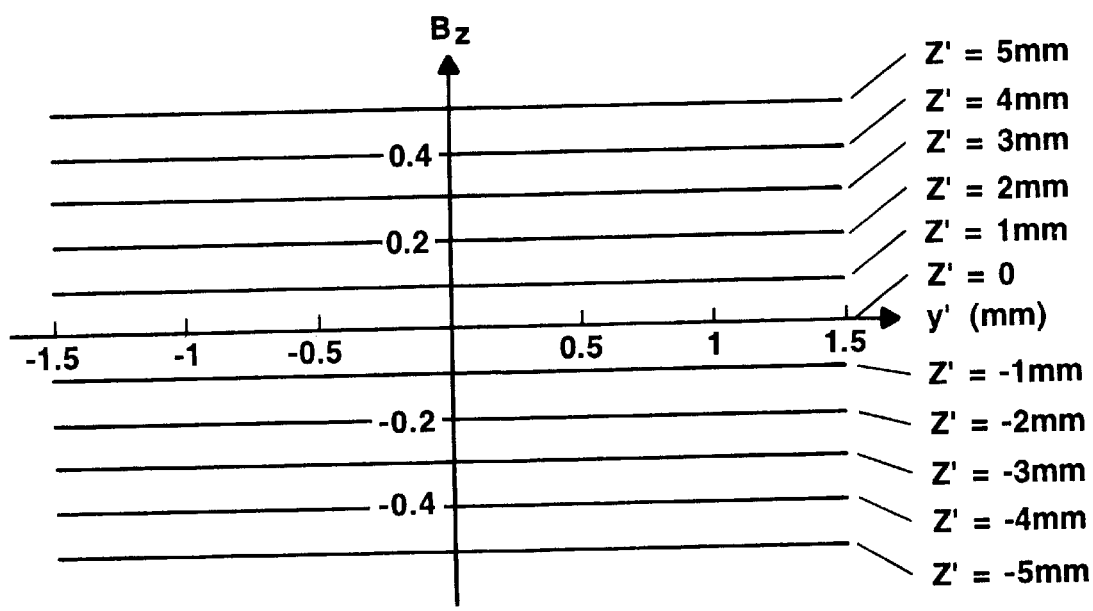
FIG. 8 is a graphical depiction of the gradient field variation for the current distribution shown in FIG. 7.
Figure 7:
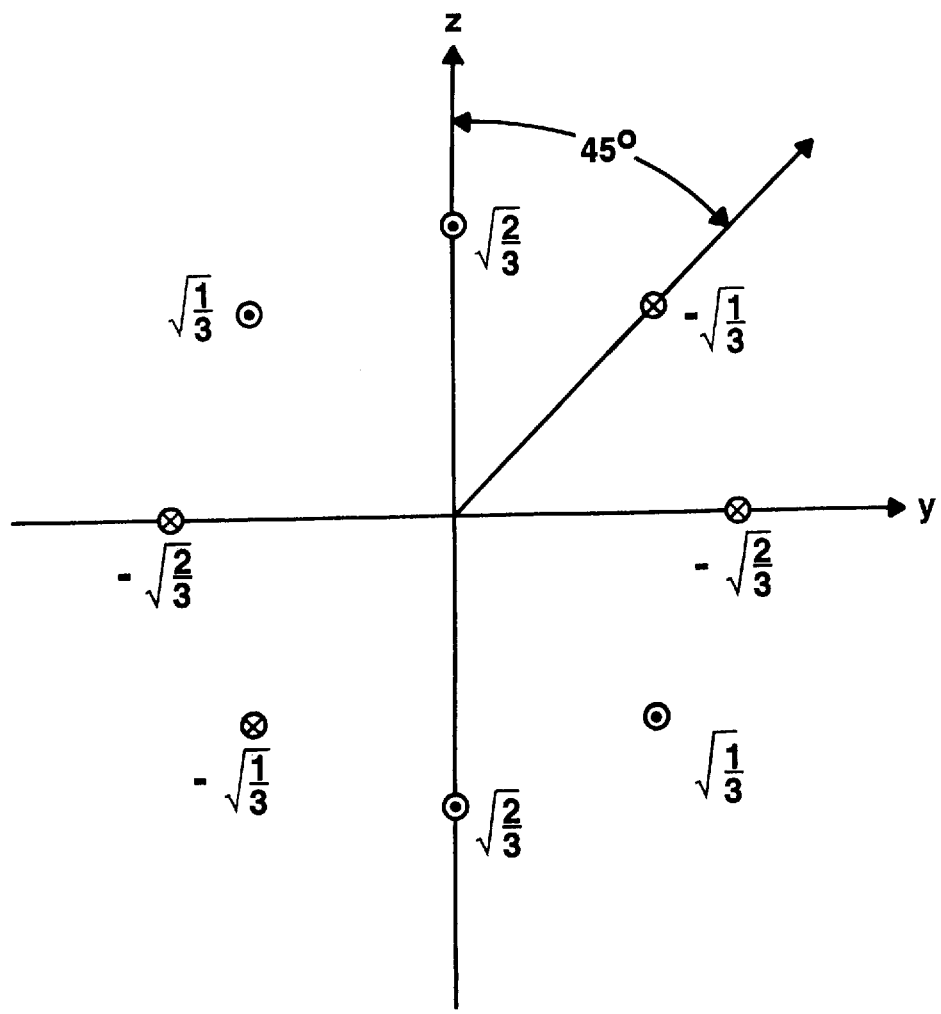
FIG. 7 is a graphical depiction of the current distribution provided by an alternative embodiment of the invention which uses eight straight line conductive segments.

An alternative embodiment of the invention is shown in FIG. 7. Like FIG. 5, FIG. 7 is a graphical depiction of the currents used to generate a desired gradient magnetic field. As shown, this embodiment uses eight currents rather than four. The currents are distributed in a cylindrical pattern, equidistant from the center of the sample volume. The magnitudes of the currents are found using the same method described above for the four-current embodiment, and are shown in FIG. 7. This distribution of currents leads to a gradient magnetic field indicated by the graphical depiction in FIG. 8. This representation is in the same form as that of FIG. 6 and, as shown, the use of eight conductors provides a slightly better linearity than the use of four conductors. However, the four-conductor embodiment is sufficiently linear for most purposes, and is preferred due to its ease of construction. Those skilled in the art will recognize that any number of conductors which is a multiple of four may be used.

Because it is the relative currents in the conductive sections which provides the desired gradient across the sample, it will be apparent to those skilled in the art that it is not necessary that the specific applied currents be DC currents, as long as the relative magnitudes of the currents of the different section remains the same. Thus, alternating currents could also be used, as long as the currents in the different sections change proportionally, and are in phase with one another. However, for the preferred embodiment taught herein, DC currents are preferred.

Although only a few illustrative embodiments of the present invention have been disclosed in the discussion above, other modifications and enhancements will be apparent to those skilled in the art, which modifications and enhancements are intended to be covered by the claims set forth below. For example, any distribution of currents that preserves the symmetry of the above described continuous current distribution will generate the desired magic angle gradient field.

What is claimed is:

1. Nuclear magnetic resonance magic angle spinning (MAS) spectroscopy apparatus for analyzing a sample contained within a sample container, the apparatus comprising:
   a static magnetic field generator for generating a static magnetic field which influences the sample, the static magnetic field being oriented in a z-direction;
   a stator for housing the sample container and allowing rotation of the sample container therein about a rotation axis having an angle $\theta_m$ relative to the z-direction of substantially $\theta_m = \cos^{-1} \sqrt{1/3}$; and
   a gradient magnetic field generator comprising a plurality of conductive sections each of which contributes to a gradient field when one of a plurality of respective predetermined currents is passed through it, the conductive sections being such that, when said predetermined currents are direct (DC) currents, the strength of the gradient field in the z-direction changes linearly along said rotation axis.

2. Apparatus according to claim 1 wherein the conductive sections are all part of a single conductor.

3. Apparatus according to claim 2 wherein the single conductor is wound about the stator.

4. Apparatus according to claim 1 wherein the conductive sections each follow a substantially straight line and are arranged in a cylindrical distribution such that they are substantially parallel to one another and substantially parallel to and equidistant from an axis passing through the sample, and wherein a normalized magnitude of each of said predetermined currents is substantially equal to $\cos(2\theta - 90° + \theta_m)$, where $\theta$ is angular position of a given conductive section relative to the z-direction.

5. Apparatus according to claim 1 wherein the gradient field is a quadrupolar field.

6. Apparatus according to claim 1 wherein the conductive sections are physically supported by the stator and the stator further comprises an ejection port through which the sample container may be ejected from the stator, the conductive sections being positioned such that they do not inhibit ejection of the sample container through the sample port.

7. Apparatus according to claim 1 further comprising magnetic shielding encompassing the conductive segments.

8. Nuclear magnetic resonance magic angle spinning (MAS) spectroscopy apparatus for analyzing a sample contained within a sample container, the apparatus comprising:
   a stator for housing the sample container and allowing rotation of the sample container therein about a rotation axis, the stator having an ejection port through which the sample may be ejected from the stator;
   a static magnetic field generator for generating a static magnetic field which influences the sample, the static magnetic field being oriented in a z-direction; and
   a gradient magnetic field generator comprising a plurality of conductive sections located adjacent to the stator each of which contributes to a gradient field when one of a plurality of respective predetermined currents is passed through it, the conductive sections including straight line conductors that approximate a cylindrical current distribution about the rotation axis and each conduct a direct (DC) current that generates a component of the gradient field, the conductors being physically supported by the stator and being located such that they do not inhibit ejection of the sample container.

9. Apparatus according to claim 8 wherein the predetermined current through each of the conductive sections is unsynchronized with the rotation of the sample.

10. Apparatus according to claim 8 wherein the conductive sections are such that the strength of the gradient field in the z-direction changes linearly along said rotation axis.

11. Nuclear magnetic resonance magic angle spinning (MAS) spectroscopy apparatus for analyzing a sample contained within a sample container, the apparatus comprising:
   a static magnetic field generator for generating a static magnetic field which influences the sample, the static magnetic field being oriented in a z-direction;

a stator for housing the sample container and allowing rotation of the sample container therein about a rotation axis, the rotation axis having an angle relative to the z-direction of substantially $\theta_m = \cos^{-1} \sqrt{1/3}$; and a gradient magnetic field generator comprising a plurality of conductive sections each of which follows a substantially straight line and contributes to a gradient field when one of a plurality of respective predetermined currents is passed through it, the conductive sections being arranged in a cylindrical distribution such that they are substantially parallel to one another and substantially parallel to and equidistant from an axis passing through the sample, and wherein a normalized magnitude of each of said predetermined currents is substantially equal to $\cos(2\theta - 90° + \theta_m)$, where $\theta$ is angular position of a given conductive section relative to the z-direction.

12. Apparatus according to claim 11 wherein the conductive sections comprise two conductive sections, each having a current of $i_1$, located along the cylindrical distribution, respectively, at $\theta \approx 17.65°$ and $\theta \approx 197.65°$, and two conductive sections, each having a current of $-i_1$, located along the cylindrical distribution, respectively, at $\theta \approx 107.65°$ and $\theta \approx 287.65°$.

13. Apparatus according to claim 11 wherein the conductive sections comprise:

two conductive sections each having a current of $(\sqrt{2/3})i_2$, located along the cylindrical distribution, respectively, at $\theta \approx 0°$ and $\theta \approx 180°$;

two conductive sections each having a current of $(-\sqrt{2/3})i_2$, located along the cylindrical distribution, respectively, at $\theta \approx -90°$ and $\theta \approx 90°$;

two conductive sections each having a current of $(\sqrt{1/3})i_2$, located along the cylindrical distribution, respectively, at $\theta \approx -45°$ and $\theta \approx 135°$; and two conductive sections each having a current of $(-\sqrt{1/3})i_2$, located along the cylindrical distribution, respectively, at $\theta \approx 45°$ and $\theta \approx -135°$.

14. A method of performing a nuclear magnetic resonance magic angle spinning (MAS) spectroscopic analysis of a sample in a rotatable sample container, the method comprising:

locating the sample container in a stator;

applying a static magnetic field which influences the sample, the static magnetic field being oriented in a z-direction;

rotating the sample container about a rotation axis having an angle relative to the z-direction of substantially $\theta_m = \cos^{-1} \sqrt{1/3}$; and applying a gradient magnetic field with a gradient magnetic field generator comprising a plurality of conductive sections each of which contributes to the gradient field when one of a plurality of respective predetermined currents is passed through it, the conductive sections being such that, when said predetermined currents are direct (DC) currents, the strength of the gradient field in the z-direction changes linearly along said rotation axis.

15. A method according to claim 14 wherein applying a gradient magnetic field further comprises applying a quadupolar gradient magnetic field.

16. A method according to claim 14 further comprising arranging the conductive sections such that they each follow a substantially straight line and are arranged in a cylindrical distribution substantially parallel to one another and substantially parallel to and equidistant from an axis passing through the sample, and wherein a normalized magnitude of each of said predetermined currents is substantially equal to $\cos(2\theta - 90° + \theta_m)$, where $\theta$ is angular position of a given conductive section relative to the z-direction.

17. A method according to claim 14 further comprising providing the conductive sections such that the each are part of a single conductor which is wound about the stator.

18. A method according to claim 14 further comprising providing the stator with an ejection port for ejection of the sample container, and physically supporting the conductive sections with the stator, the conductive sections being positioned such that they do not inhibit ejection of the sample container through the ejection port.

19. A method according to claim 14 further comprising encompassing the conductive segments with magnetic shielding.

* * * * *